(12) United States Patent
Huang et al.

(10) Patent No.: US 6,335,942 B1
(45) Date of Patent: Jan. 1, 2002

(54) FREQUENCY STABILIZED PASSIVELY Q-SWITCHED LASER

(75) Inventors: Sheng-Lung Huang; Fu-Jen Kao; Tzyy-Sheng Horng; Wood-Hi Cheng; Tsung-Yuan Tsui; Huy-Zu Cheng, all of Kaohsiung (TW)

(73) Assignee: National Science Council of Republic of China, Taipei (TW)

( * ) Notice: Subject to any disclaimer, the term of this patent is extended or adjusted under 35 U.S.C. 154(b) by 0 days.

(21) Appl. No.: 09/414,515

(22) Filed: Oct. 8, 1999

(51) Int. Cl.[7] .............................. H01S 3/11; H01S 3/113; H01S 3/091; H01S 3/08

(52) U.S. Cl. ........................ 372/10; 372/11; 372/75; 372/106

(58) Field of Search .................. 372/10, 11, 25, 372/43, 75, 94, 106

(56) References Cited

U.S. PATENT DOCUMENTS

| | | | |
|---|---|---|---|
| 4,521,109 A | * | 6/1985 | Chenausky et al. ......... 356/349 |
| 4,864,577 A | * | 9/1989 | Aoshima et al. ............... 372/18 |
| 5,414,724 A | * | 5/1995 | Zhou et al. ..................... 372/10 |
| 5,434,875 A | * | 7/1995 | Reiger et al. .................. 372/25 |
| 6,002,704 A | * | 12/1999 | Freitag et al. ................. 372/94 |

* cited by examiner

Primary Examiner—Frank G. Font
Assistant Examiner—Armando Rodriguez
(74) Attorney, Agent, or Firm—Bacon & Thomas

(57) ABSTRACT

The invention is a frequency stabilized passive Q-switch laser, which has the advantages of small volume, simple structure, no need for high power voltage, etc. It has been a long time that timing jitter in conventional lasers is so large that they can not be applied to fields such as distance measurement. This invention utilizes an optical external modulation method to stabilize the repetition rate of the passive Q-switch, and thus to decrease its timing jitter. At the same time, the repetition rate of the Q-switch laser can be controlled by the same technology to meet various application needs.

4 Claims, 7 Drawing Sheets

FREQUENCY STABILIZED PASSIVELY Q-SWITCHED LASER

BACKGROUND OF THE INVENTION

1. Field Of The Invention

The invention relates to a frequency stabilized passive Q-switch laser and, in particular, to a passive Q-switch laser that stabilizes its repetition rate by utilizing the optical external modulation.

2. Description Of The Prior Art

The passive Q-switch laser has many good merits over the active Q-switch laser, for example, it does not need high voltage power supply and high frequency electronic circuit, it is small in volume, and so on. However, the passive Q-switch lasers used to use dyes as the saturable absorber in early development, and therefore could not reach the high peak value in output power. In the recent years, the newly developed solid saturable absorber, the Cr:YAG crystal, can undertake a fairly large power (>500MW/cm$^2$) and receives broad attention.

Nonetheless, conventional passive Q-switch lasers often suffer from the spontaneous emitted photons in the cavity and having unstable repetition frequencies that generate more than 20% of timing jitter. As shown in FIG. 1, the minimum average number of photons (φmin) of stimulated emission in the cavity can have a great influence on the repetition rate of the lasers even it is extremely low. The following equation tells us the contribution to the generation of stimulated emission, φ, in the cavity due to the spontaneous power, $P_{sp}$:

$$Psp \approx \frac{\varphi \times h\upsilon}{\tau} \frac{4\pi}{\Omega} \frac{\Delta W_{spon}}{\Delta W_{laser}},$$

where hυ is the photon energy, Ω is the solid angle of the laser beam in the cavity, $\Delta W_{laser}$ and $\Delta W_{spon}$ are the laser and spontaneous linewidths, respectively. The computer simulation results in FIG. 1 are taken by assuming a laser system consisting of a 5 mm-thick, 1 at % doped Nd:YAG crystal and a Cr$^{4+}$:YAG crystal with 90% and 80% low power transmittances located in a half-symmetric laser cavity. This computer model has been compared and agreed with the experiments, as shown in FIG. 2.

Since the spontaneous radiation laser crystal, after stimulation, will generate the natural phenomena of timing jitter, which can not be filtered out, therefore there is no way to solve the problem of the unstable repetition rate of the passive Q-switch laser.

Thus, the above mentioned prior art still has many drawbacks. It is not a good design and needs modification. In observation of the many disadvantages in the prior art, the inventor sought to improve the technology and finally came up with this frequency stabilized passive Q-switch laser after many years of research and hardworking.

SUMMARY OF THE INVENTION

The invention provides a frequency stabilized passive Q-switch laser, where the volume of the semiconductor laser or the solid state laser stimulated by the semiconductor laser is small and consumes little electric power. Thus it is possible to achieve the effects of stabilizing and controlling the frequency almost without increasing the volume and power consumption of the passive Q-switch laser. Furthermore, the instant invention provides a frequency stabilized passive Q-switch laser, which utilizes the optical external modulation method to stabilize the repetition rate of the passive Q-switch, and thus to lower its timing jitter. At the same time, the repetition rate of the Q-switch laser can be controlled by the same technology to meet various application needs.

The frequency stabilized passive Q-switch laser with the above mentioned merits comprises an external amplitude-modulated semiconductor laser or a solid state laser stimulated by the semiconductor laser. The wavelength falls within the absorption wavelength range of the saturable absorber in the passive Q-switch laser so that the number of electrons in the ground and excited states of the saturable absorber can be modulated, and thus the repetition rate of the laser is stabilized by the external modulation.

BRIEF DESCRIPTION OF THE DRAWINGS

The drawings disclose an illustrative embodiment of the present invention which serves to exemplify the various advantages and objects hereof, and are as follows.

| Main Symbols | | | |
|---|---|---|---|
| 1 | solid state laser cavity | 11 | semiconductor laser |
| 12 | coupling optics | 13 | gain medium |
| 14 | saturable absorber | 15 | output coupler |
| 16 | modulation light source | 16a | modulation light source |
| 17 | polarized beam splitter | | |

DETAILED DESCRIPTION OF THE PREFERRED EMBODIMENT

The present invention is achieved by employing an external amplitude-modulated semiconductor laser or a solid state laser stimulated by the semiconductor laser, whose wavelength falls within the absorption wavelength range of the saturable absorber in the passive Q-switch laser, so that the number of electrons in the ground and excited states of the saturable absorber can be modulated, and thus the repetition rate of the laser is stabilized by the external modulation. The population difference between the excited and ground states in the saturable absorber, when externally modulated, can be expressed in the following way:

$$n_{sm} = n_s + \delta \cos(W_m t),$$

where $n_{sm}$ and $n_s$, are the population differences before and after modulation, is the modulation frequency, and $\delta$ is the modulation amplitude.

Figure 1:
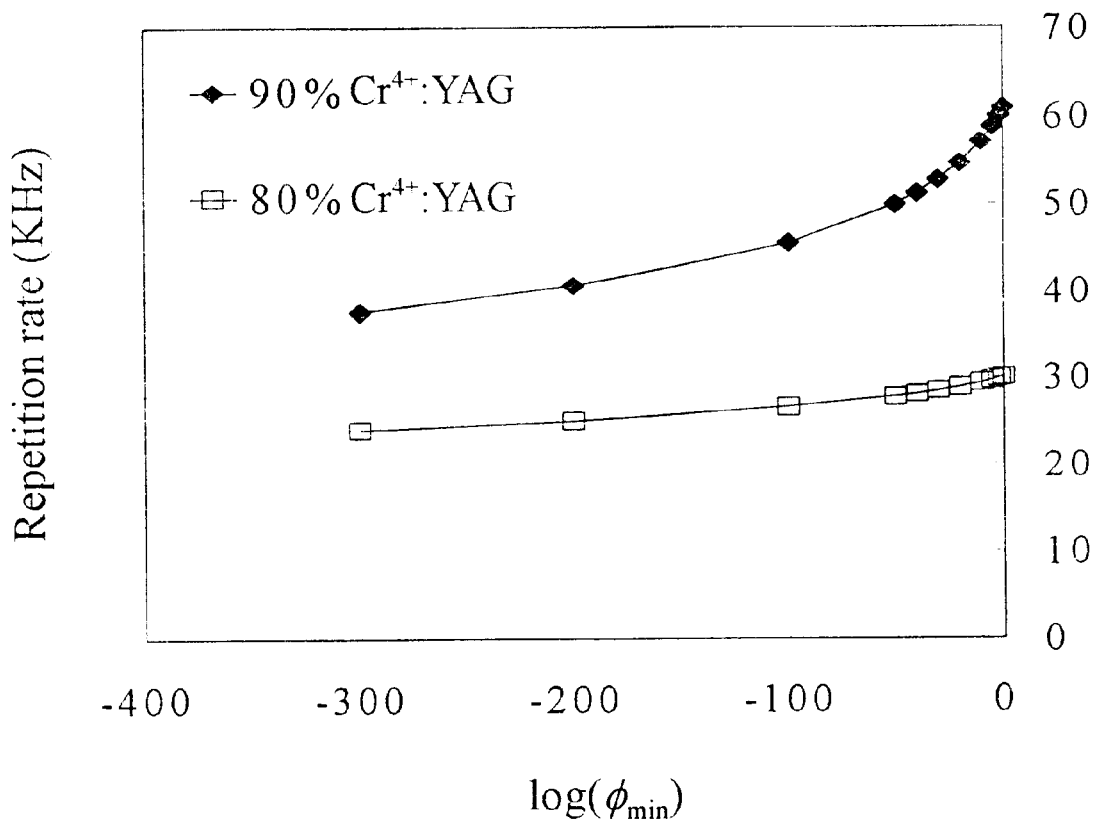
FIG. 1 is the plot of the repetition rate versus the minimum photon number in the cavity of a frequency stabilized passive Q-switch laser according to the present invention.
Figure 2A:
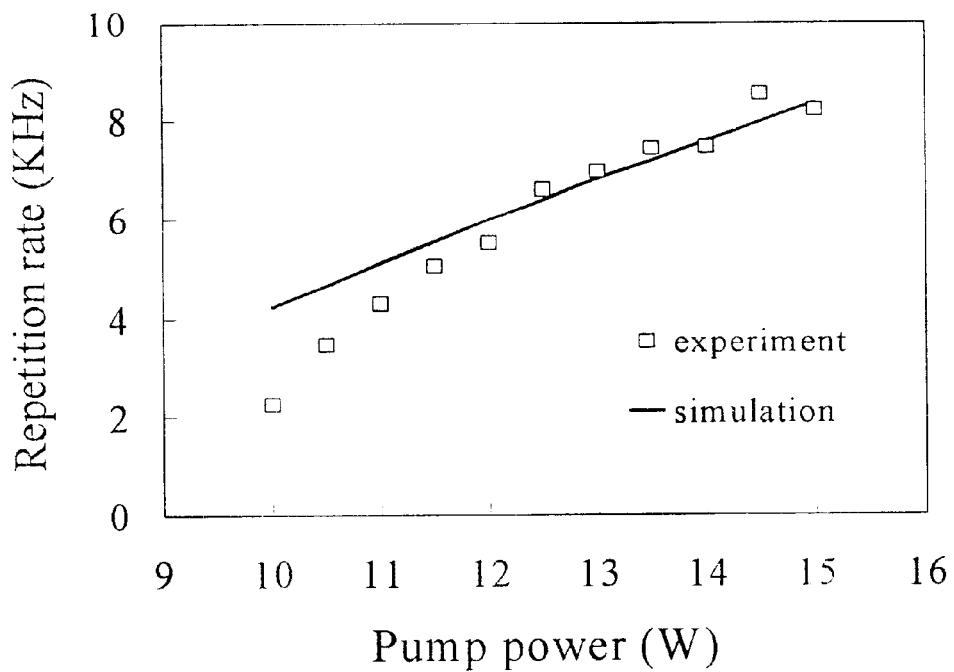
FIG. 2(a) is a comparison between repetition rates of a frequency stabilized passive Q-switch laser from both the experiment and the computer simulation.
Figure 2B:
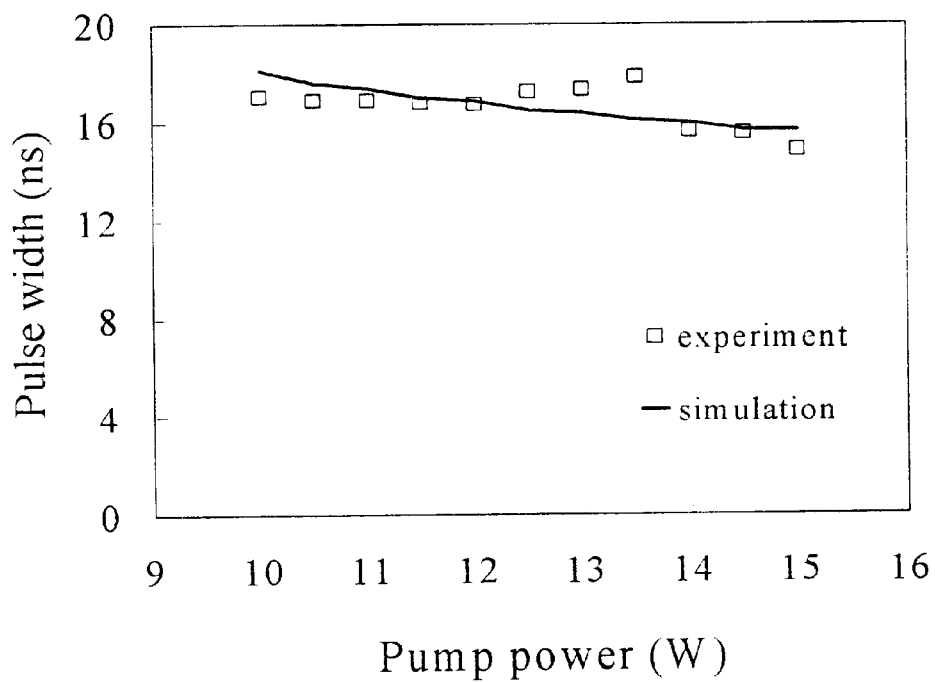
FIG. 2(b) is a comparison between pulse widths of a frequency stabilized passive Q-switch laser from both the experiment and the computer simulation.
Figure 3:
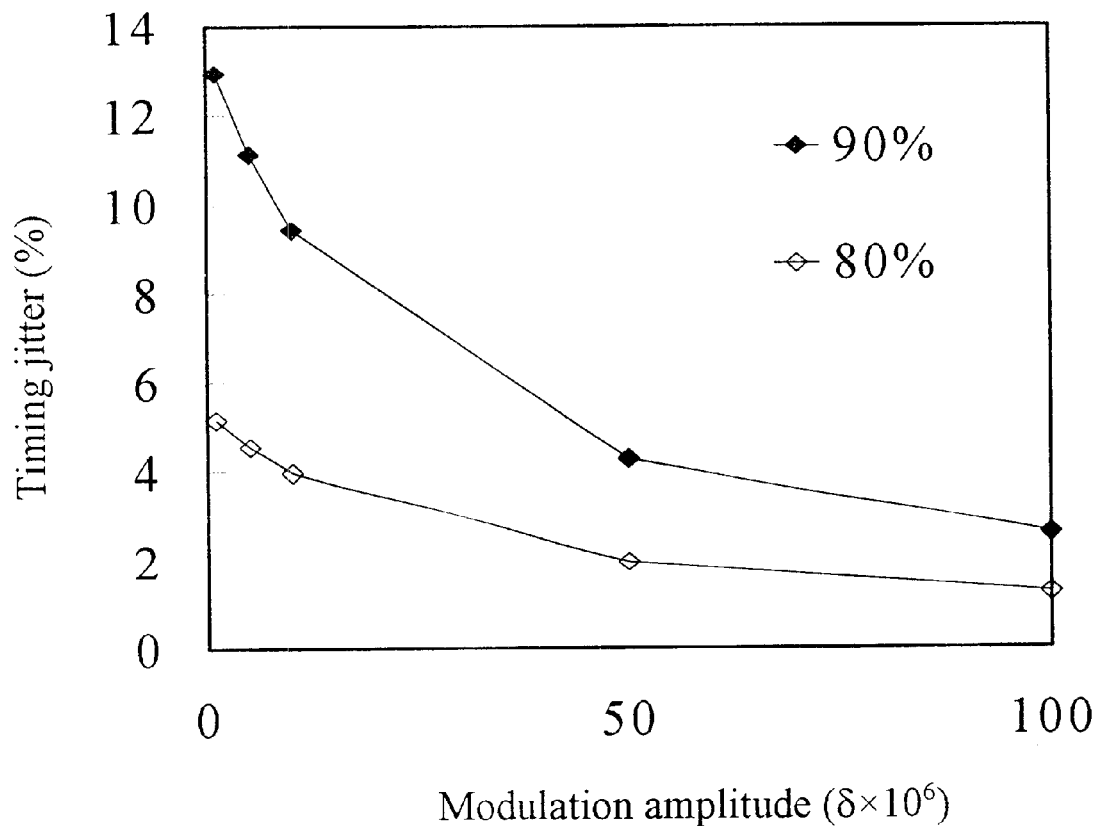
FIG. 3 shows the dependence of the timing jitter on the modulation amplitude of a frequency stabilized passive Q-switch laser according to the invention.

Please refer to FIG. 3, which shows the dependence of the timing jitter on the modulation amplitude of a frequency stabilized passive Q-switch laser according to the invention. The diagram shows the influence of various modulation amplitudes on the timing jitter. As expected, the larger the modulation amplitude is, the more improvement the timing jitter gets. This is especially remarkable for a $Cr^{4+}$:YAG crystal with 90% low power transmittance.

Figure 4:
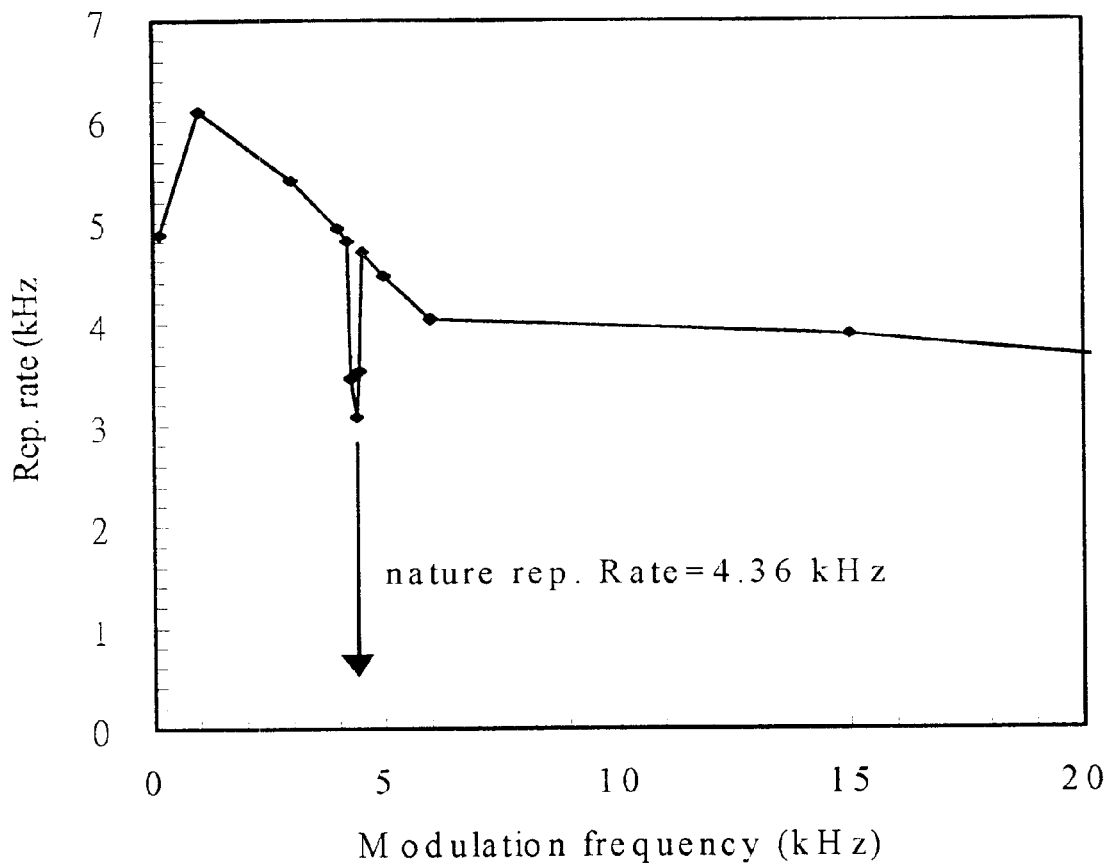
FIG. 4 shows the dependence of the repetition rate on the modulation frequency of a frequency stabilized passive Q-switch laser according to the invention.

Please refer to FIG. 4, which shows the dependence of the repetition rate on the modulation frequency of a frequency stabilized passive Q-switch laser according to the invention. As shown in the diagram produced by the computer simulation, this modulation technology does not only stabilize the frequency, but also varies the repetition rate of the Q-switch laser according to the change in the modulation frequency. The frequency control in the frequency stabilizing fashion can be achieved in the range from one tenth to ten times the natural repetition rate. Conventionally, changing the repetition rate of the passive Q-switch laser is realized by changing the power of the stimulating light source or the cavity length. But both methods spoil the design of the hot cavity and lower the efficiency.

One advantage of the present invention is that the volume of the semiconductor laser or the solid state laser stimulated by the semiconductor laser is small and consumes little electric power. Thus it is possible to achieve the effects of stabilizing and controlling the frequency almost without increasing the volume and power consumption of the passive Q-switch laser.

Please refer to FIG. 5, which is the structural diagram of guiding the modulation light source into the cavity of a frequency stabilized passive Q-switch laser according to the invention. From the diagram, we know that the structure of the invention is a half-symmetric cavity of the Nd:YAG or Nd:YVO$_4$ solid state laser 1, which comprises:

a semiconductor laser 11, used to generate population reverse within a gain medium 13;

a coupling optics 12, which effectively guides the light power generated by the semiconductor laser 11 into the gain medium 13;

a gain medium 13 for amplifying the light and forming the laser;

a saturable absorber 14, which is a two-level system whose absorption coefficient is inversely proportional to the laser power in the cavity;

a polarized beam splitter 17, which can both linearly polarize the photons in the cavity and guide the modulation light source 16;

a modulation light source 16 for controlling or modulating the population within the saturable absorber 14; and an output coupler 15 for determining the ratio of the laser output.

Figure 5A:
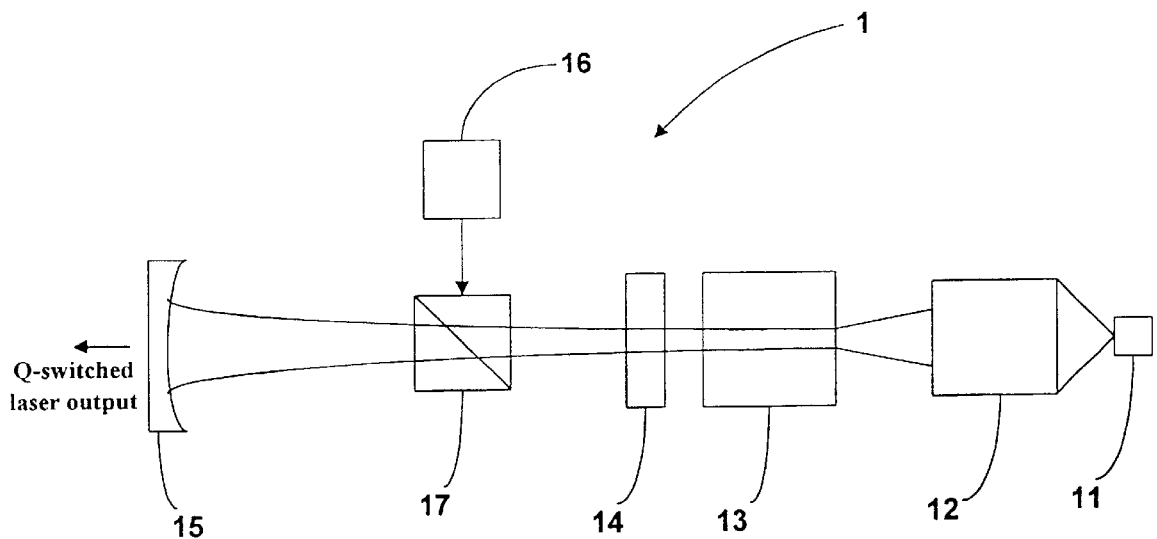
FIGS. 5(a), 5(b) is the structural diagram of guiding the modulation light source into the cavity of a frequency stabilized passive Q-switch laser according to the invention.
Figure 5B:
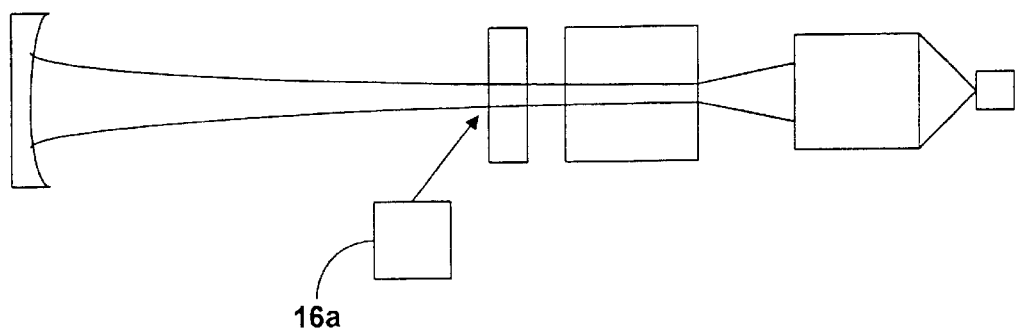

The above elements form a light path of a frequency stabilized passive Q-switch laser according to the invention, which includes a straight light path oscillating between the gain medium 13 and the output coupler 15, and a L-shape one-way light path for the modulation light source 16 from the modulation light source 16 via the polarized beam splitter 17 to the saturable absorber 14. The high power semiconductor laser 11 is stimulated by the coupling optics 12 with a stimulated wavelength of about 808 nm. The light passes through a gain medium 13. The Cr:YAG crystal is used in the solid state laser cavity as the saturable absorber 14 to achieve the goal of Q-switch. The reflectivity of the output coupler 15 in the cavity 1 is in the range of 85% to 95%. In FIG. 5, we list two possible methods to modulate the electron population difference between the excited and ground levels within the Cr:YAG crystal. The modulation light source in FIG. 5(a) is guided into the Cr:YAG crystal via a polarized beam splitter 17, while the modulation light source 16a in FIG. 5(b) is directed into the Cr:YAG crystal in the vertical and horizontal methods, respectively.

Figure 6A:
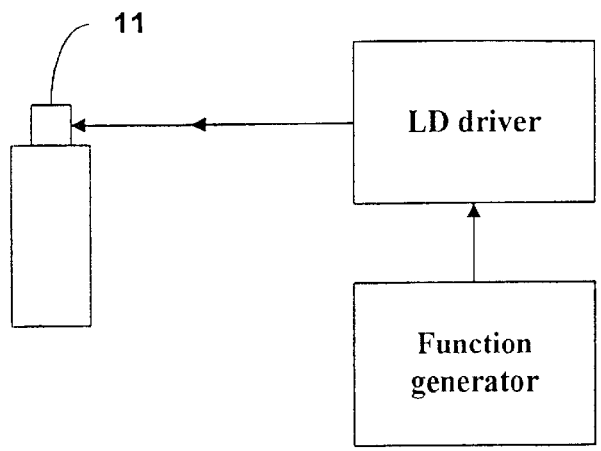
FIGS. 6(a), 6(b) is a demonstrative diagram of the modulation light source of a frequency stabilized passive Q-switch laser according to the invention.
Figure 6B:
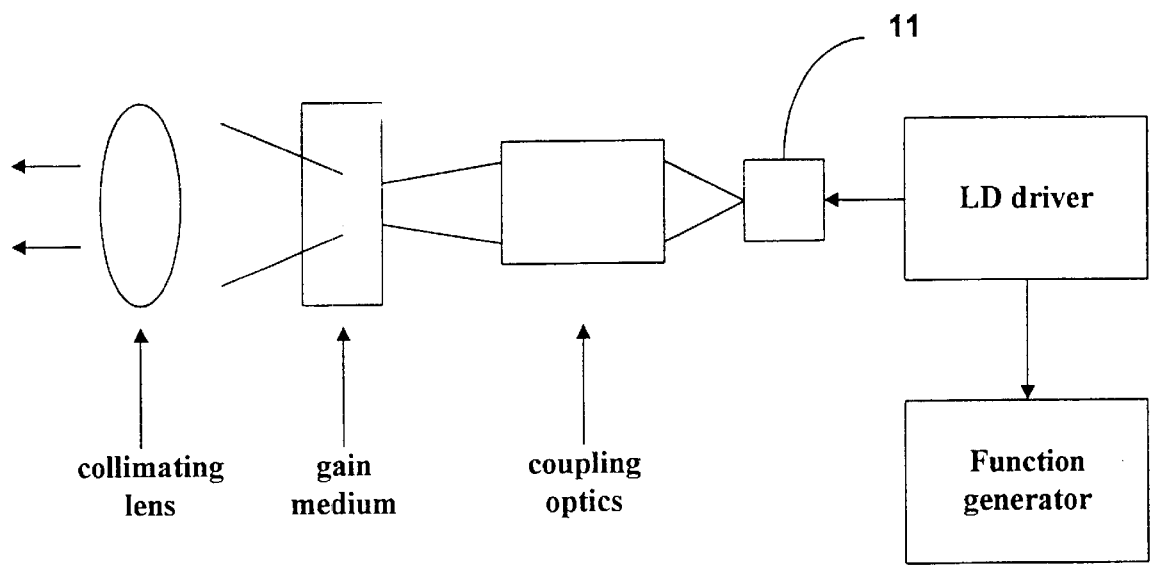

Please refer to FIG. 6, which is a demonstrative diagram of the modulation light source of a frequency stabilized passive Q-switch laser according to the invention. From the diagram we know that FIG. 6(a) uses the semiconductor laser 11 as the modulation directly, while FIG. 6(b) uses the light source with a wavelength of 1.064 $\mu$m generated from the Nd:YAG or Nd:YVO$_4$ solid state laser crystal stimulated by a semiconductor laser 11 to modulate the Cr:YAG crystal.

Figure 7:
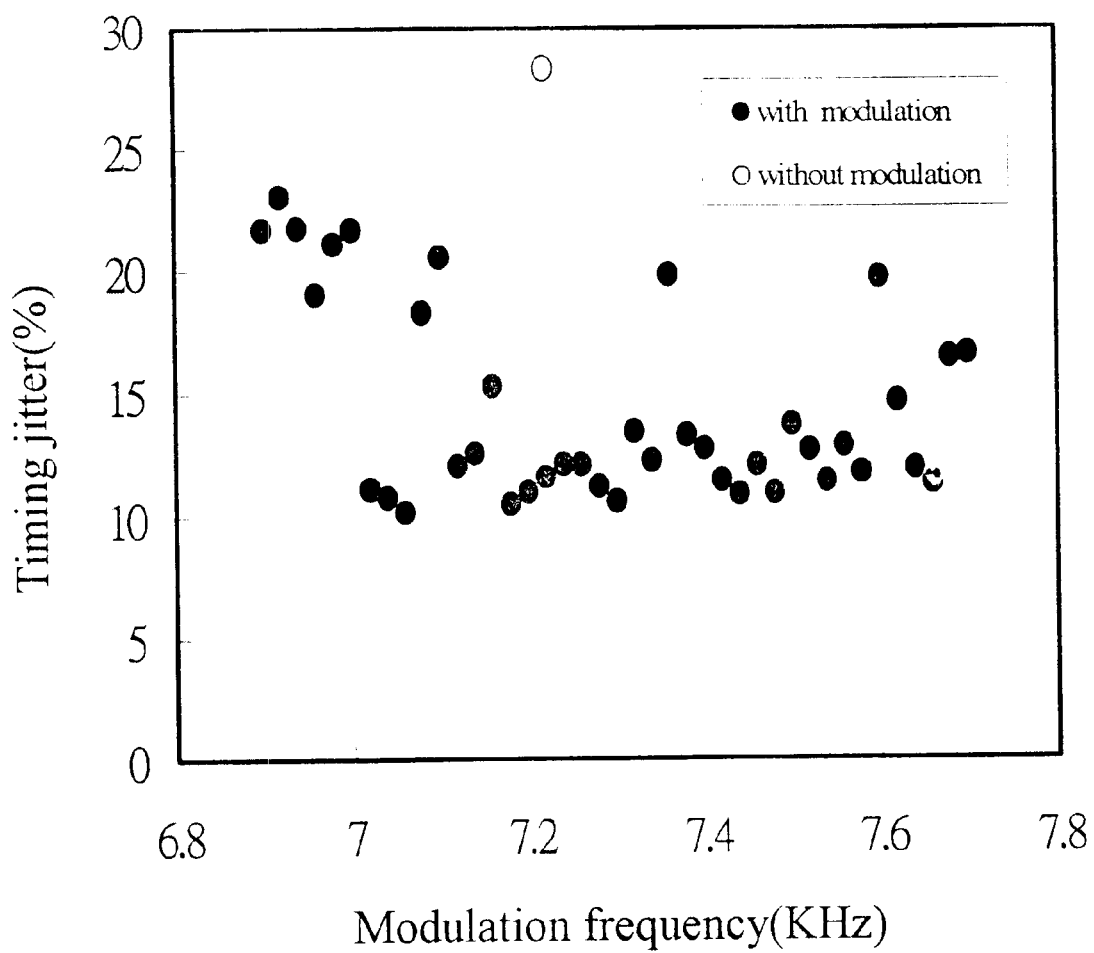
FIG. 7 is the experimental result of improved timing jitter controlled by the external modulation on a frequency stabilized passive Q-switch laser according to the invention.

Please refer to FIG. 7, which is the experimental result of improved timing jitter controlled by the external modulation on a frequency stabilized passive Q-switch laser according to the invention. This proves the feasibility of the instant invention. Since it is modulated through the above-mentioned stimulated population, thus the semiconductor laser power used here is higher, around several hundreds of mW.

The frequency stabilized passive Q-switch laser, when compared with other prior arts, has the following merits:

1. The volume of the semiconductor laser or the solid state laser stimulated by the semiconductor laser is small and consumes little electric power. Thus it is possible to achieve the effects of stabilizing and controlling the frequency almost without increasing the volume and power consumption of the passive Q-switch laser.

2. This invention utilizes the optical external modulation method to stabilize the repetition rate of the passive Q-switch, and thus to lower its timing jitter. At the same time, the repetition rate of the Q-switch laser can be controlled by the same technology to meet various application needs.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A frequency stabilized passive Q-switch laser with a half-symmetric cavity of a Nd:YAG or Nd:YVO$_4$ solid state laser, which comprises:

a semiconductor laser;

a gain medium for amplifying and forming laser light in said cavity due to population reversion driven by light power from said semiconductor laser coupling optics arranged to guide light power generated by said semiconductor laser into said gain medium;

a saturable absorber in the form of a two-level system whose absorption coefficient is inversely proportional to the laser power in the cavity;

a modulation light source for controlling or modulating the population within said saturable absorber;

a polarized beam splitter arranged to both linearly polarize the photons in the cavity and guide modulation light from the modulation light source to said saturable absorber; and an output coupler for determining the ratio of the laser output;

wherein the above elements form a light path, which includes a straight light path oscillating between said gain medium and said output coupler, and an L-shape one-way light path for said modulation light from said modulation light source via said polarized beam splitter to said saturable absorber.

2. A frequency stabilized passive Q-switch laser as of claim 1, wherein said modulation light source is amplitude- or frequency- modulated and the repetition rate is between one tenth and ten times the natural repetition frequency of said passive Q-switch laser.

3. A frequency stabilized passive Q-switch laser as of claim 1, wherein said solid state laser uses the Cr:YAG crystal as said saturable absorber in the cavity.

4. A frequency stabilized passive Q-switch laser with a half-symmetric cavity of a Nd:YAG or Nd:YVO$_4$ solid state laser, which comprises:

a semiconductor laser;

a gain medium for amplifying and forming laser light in said cavity due to population reversion driven by light power from said semiconductor laser coupling optics arranged to guide light power generated by said semiconductor laser into said gain medium;

a saturable absorber in the form of a two-level system whose absorption coefficient is inversely proportional to the laser power in the cavity;

a modulation light source for controlling or modulating the population within said saturable absorber; and an output coupler for determining the ratio of the laser output;

wherein the modulation light source is arranged to directly illuminate said saturable absorber in order to control or modulate the population within the saturable absorber.

* * * * *